(12) United States Patent
Chen et al.

(10) Patent No.: US 7,872,685 B2
(45) Date of Patent: Jan. 18, 2011

(54) CAMERA MODULE WITH CIRCUIT BOARD

(75) Inventors: Yung-Chou Chen, Taipei Hsien (TW);
Su-Jen Cheng, Taipei Hsien (TW);
Wen-Chang Chen, Taipei Hsien (TW);
Fu-Yen Tseng, Taipei Hsien (TW);
Chi-Jen Chen, Taipei Hsien (TW)

(73) Assignee: Hon Hai Precision Industry Co., Ltd.,
Tu-Cheng, Taipei Hsien (TW)

( * ) Notice: Subject to any disclaimer, the term of this patent is extended or adjusted under 35 U.S.C. 154(b) by 434 days.

(21) Appl. No.: 11/862,515

(22) Filed: Sep. 27, 2007

(65) Prior Publication Data

US 2008/0252774 A1  Oct. 16, 2008

(30) Foreign Application Priority Data

Apr. 10, 2007 (CN) .................. 2007 1 0200425

(51) Int. Cl.
*H04N 5/225* (2006.01)
(52) U.S. Cl. .................. 348/372; 348/373; 348/335; 348/340; 348/345
(58) Field of Classification Search ............. 348/335, 348/340, 345, 372, 373–376; 359/665; D16/200, D16/217, 334, 101, 304
See application file for complete search history.

(56) References Cited

U.S. PATENT DOCUMENTS

| | | | | |
|---|---|---|---|---|
| 7,391,460 | B2 * | 6/2008 | Abe et al. | 348/341 |
| 7,672,060 | B2 * | 3/2010 | Campbell | 359/666 |
| 2001/0009441 | A1 * | 7/2001 | Ishida | 348/335 |
| 2003/0016300 | A1 * | 1/2003 | Ting | 348/335 |
| 2006/0124746 | A1 * | 6/2006 | Kim et al. | 235/472.02 |
| 2007/0057150 | A1 | 3/2007 | Webster | |
| 2008/0088939 | A1 * | 4/2008 | Jung | 359/665 |

* cited by examiner

*Primary Examiner*—Yogesh K Aggarwal
(74) *Attorney, Agent, or Firm*—Jeffrey T. Knapp

(57) ABSTRACT

A camera module includes an image sensor, a lens module and a circuit board. The lens module is disposed at an object side of the image sensor and has a plurality of electrical connection points thereon. The circuit board includes a main body and a bent portion electrically connecting with the main body. The image sensor is mounted on the main body and received between the lens module and the main body. The bent portion extends from a side surface of the main body and a plurality of electrical connection points is formed on the bent portion corresponding to the electrical connection points of the lens module. The electrical connection points of the bent portion are configured for connecting with the electrical connection points of the lens module to supply power to the lens module.

14 Claims, 3 Drawing Sheets

CAMERA MODULE WITH CIRCUIT BOARD

BACKGROUND

1. Technical Field

The present invention relates to camera modules and, particularly, to a camera module with a circuit board with enhanced electro-magnetic interference (EMI) shielding.

2. Description of Related Art

With the development of the optical imaging technology, camera modules are becoming widely used in electronic devices such as digital cameras and mobile phones.

FIG. 3 shows a camera module 10 according to a related article of technology. The camera module 10 includes an image sensor 11, a lens module 12 and a printed circuit board 13. The image sensor 11 is mounted on a first surface 131 of the printed circuit board 13 and is electrically connected with the printed circuit board 13. The lens module 12 includes lenses, barrel, focus adjusting mechanism and so on. The lens module 12 is disposed on a side of the image sensor 11 away from the printed circuit board 13 by on a bracket 14 mounted on the image sensor 11. The lens module 12 has a metal casing 15 acting as electro magnetic interference (EMI) shielding. The lens module 12 has a plurality of pins 121 and the printed circuit board 13 has a plurality of pinholders 133 corresponding to the pins 121. The pins 121 can be plugged into the pinholders 133 and fixed by, for example, metallurgical means, to a second surface 132 of the printed circuit board 13 opposite to the first surface 131. The lens module 12 is electrically connected to the printed circuit board 13 with the pins 121, accordingly, the printed circuit board 13 can supply power to the lens module 12.

In the camera module 10, because the pins 121 are joined to the second surface 132 of the printed circuit board 13, the second surface 132 will be uneven. The second surface 132 cannot easily be grounded, and is a poor EMI shield for the camera module 10. Further, the printed circuit board 13 is also difficult to fix in place with an uneven second surface 132.

What is needed, therefore, is a camera module with a circuit board which has enhanced grounding and EMI shielding.

SUMMARY

In accordance with one embodiment, a camera module includes an image sensor, a lens module and a circuit board. The lens module is disposed at an object side of the image sensor and has a plurality of electrical connection points thereon. The circuit board includes a main body and a bent portion electrically connecting with the main body. The image sensor is mounted on the main body and receives between the lens module and the main body. The bent portion extending from a side surface of the main body and with a plurality of electrical connection points formed thereon corresponding to the electrical connection points of the lens module. The electrical connection points of the bent portion are configured (i.e., structured and arranged) for connecting with the electrical connection points of the lens module to supply power to the lens module.

In accordance with one embodiment, a circuit board using in a camera module includes a main body for mounting an image sensor of the camera module and a bent portion electrically connecting with the main body. The bent portion extends from a side surface of the main body and has a plurality of electrical connection points formed thereon. The electrical connection points on the bent portion are configured for supplying power to the lens module.

BRIEF DESCRIPTION OF THE DRAWING

Many aspects of the present camera module can be better understood with reference to the following drawings. The components in the drawing are not necessarily drawn to scale, the emphasis instead being placed upon clearly illustrating the principles of the present camera module. Moreover, in the drawing, like reference numerals designate corresponding parts throughout the several views.

DETAILED DESCRIPTION OF THE EMBODIMENTS

Embodiments will now be described in detail below with reference to the drawings.

Figure 1:
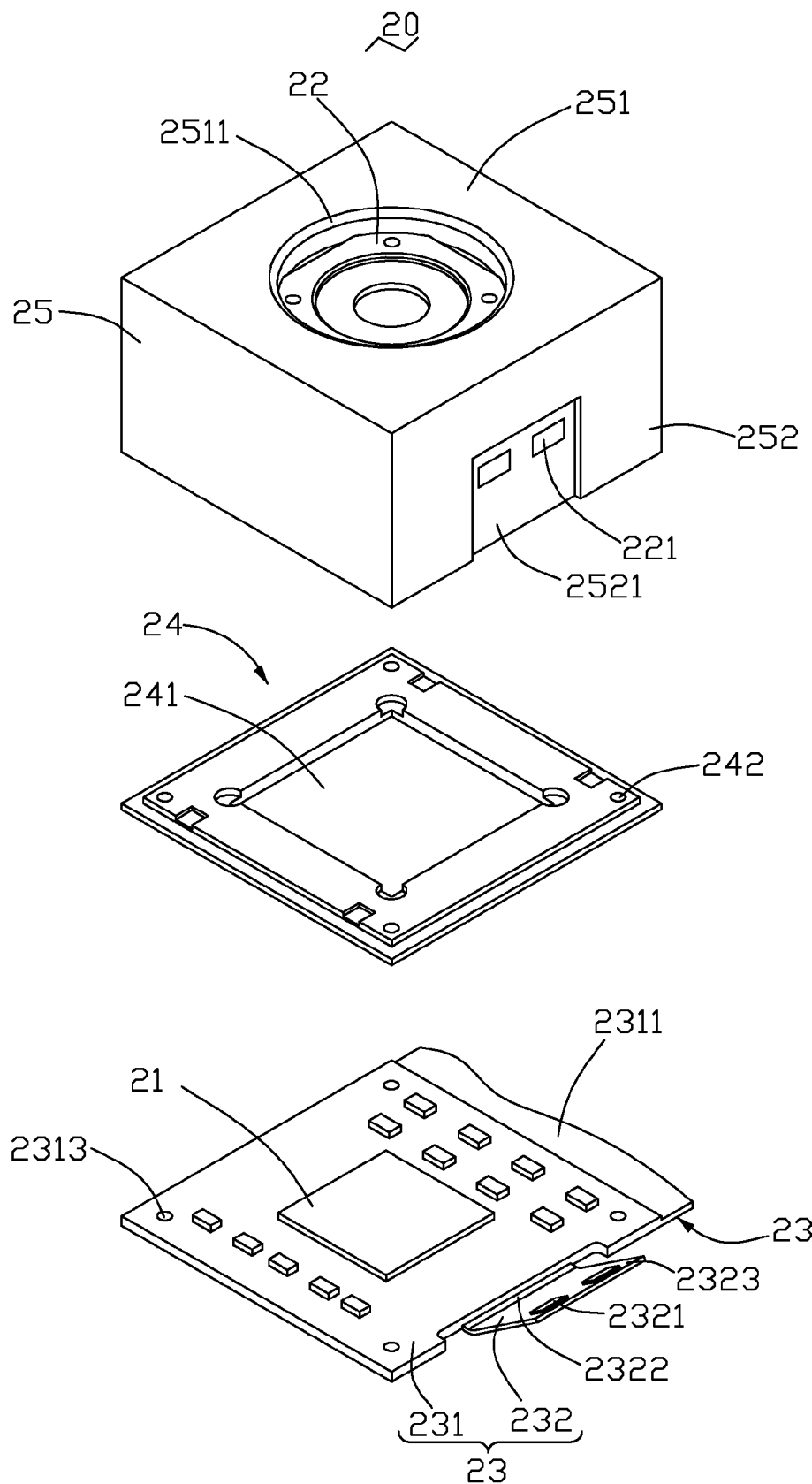
FIG. 1 is a schematic, exploded view of a camera module according to an embodiment.
Figure 2:
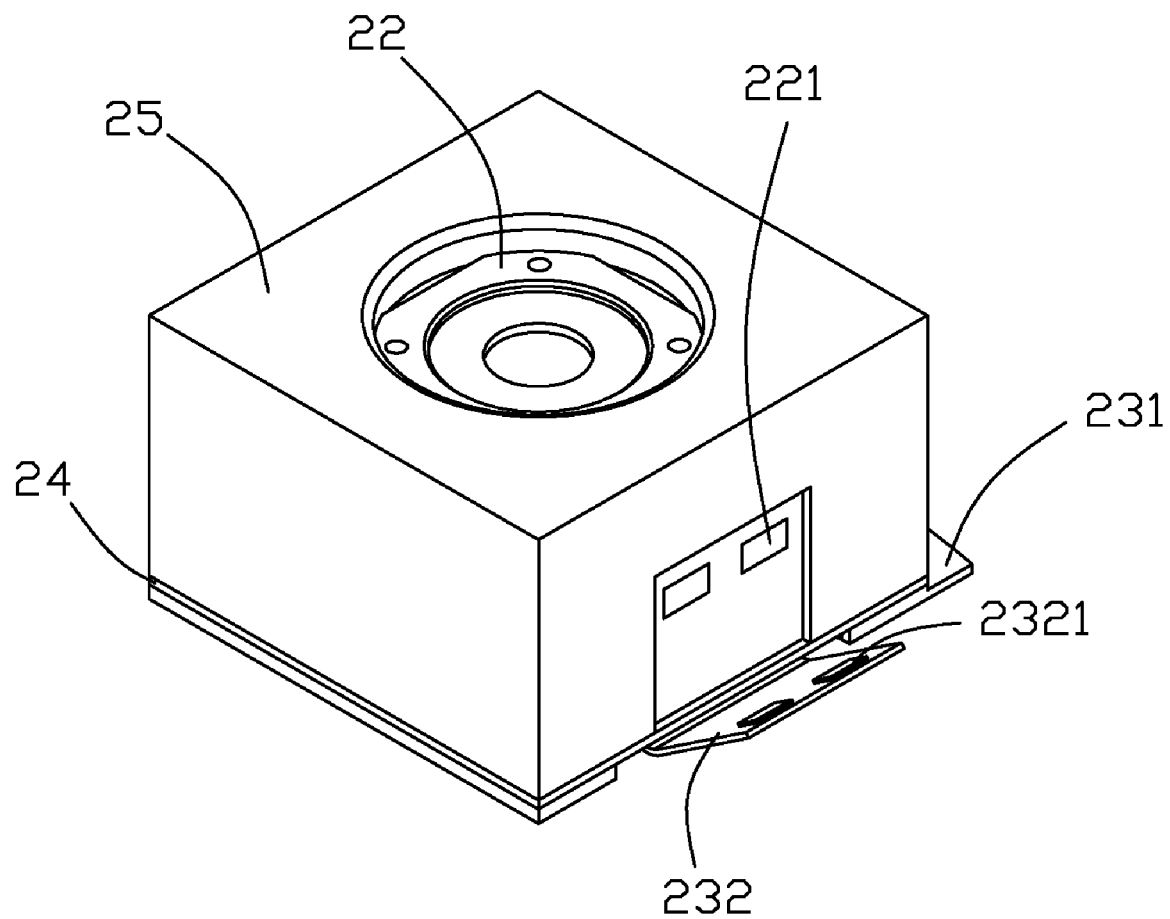
FIG. 2 is a schematic, perspective view the camera module of FIG. 1 after assembly.
Figure 3:
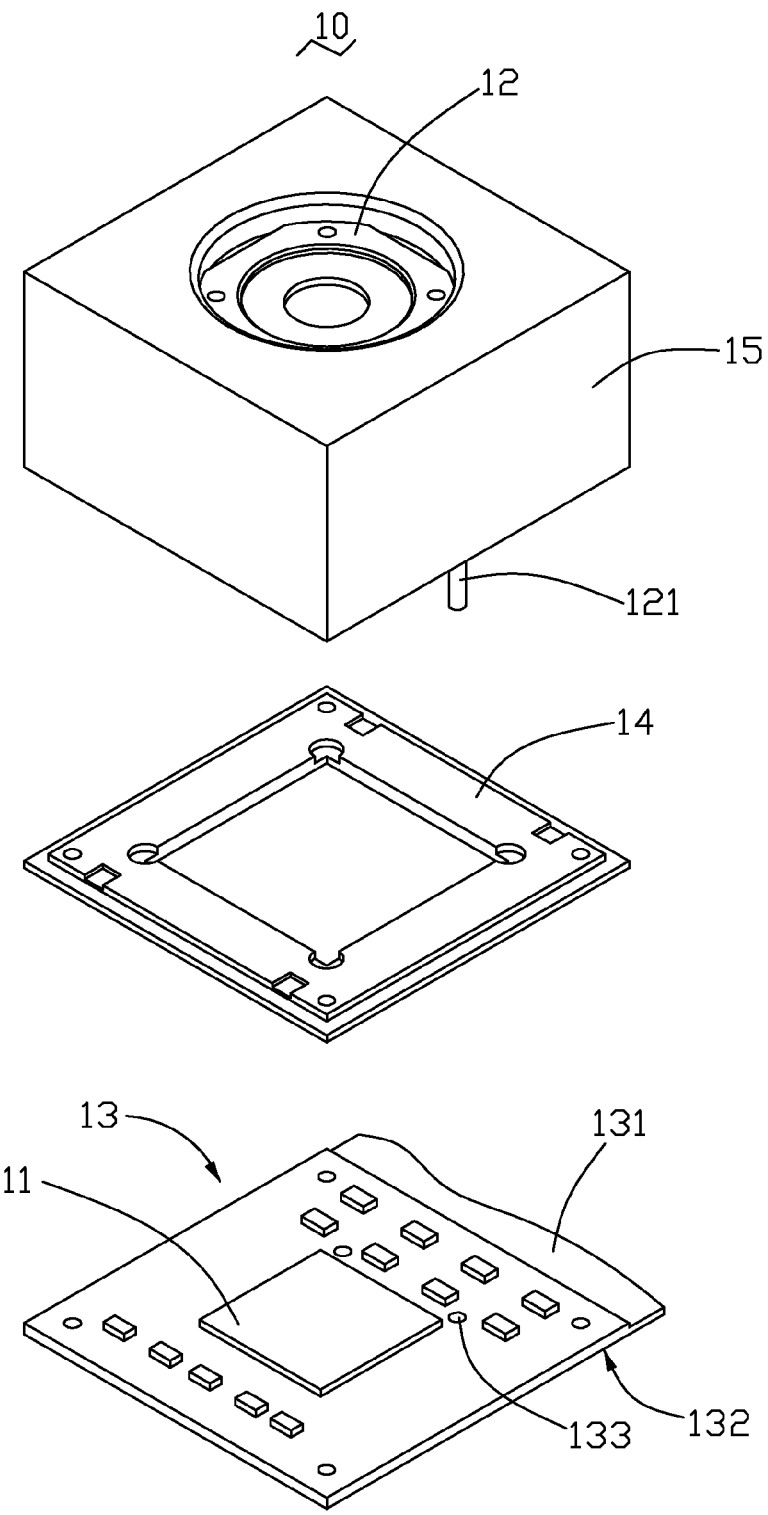
FIG. 3 is a schematic, exploded view of a camera module according to the related art.

In FIG. 1 and FIG. 2, a camera module 20 according to a preferred embodiment is shown. The camera module 20 includes an image sensor 21, a lens module 22 and a circuit board 23.

In present embodiment, the circuit board 23 is a printed circuit board. The circuit board 23 includes a main body 231 and a flexible bent portion 232 electrically connecting with the main body 231.

The main body 231 has a first surface 2311 and a second surface 2312 opposite to the first surface 2311. The image sensor 21 is mounted on the first surface 2311.

The bent portion 232 extends from a side surface of the main body 231 and can bend relative to the main body 231. The bent portion 232 includes a connecting part 2322 connected to the main body 231 and an attachable part 2323 extending from the connecting part 2322 and capable of being bent relative to the connecting part 2322 about a joining line parallel to the first surface 2322, between the attachable part 2323 and the connecting part 2322. Preferably, the attachable part 2323 can bend more than 90 degrees relative to the connecting part 2322. A plurality of electrical connection points 2321 is formed on the attachable part 2323. The electrical connection points 2321 are configured for supplying power to the lens module 22.

The image sensor 21 is electrically connected to the circuit board 23 and can convert optical signals to image signals. The image sensor 21 can, e.g., be a charge-coupled device (CCD) or a complementary metal oxide semiconductor device (CMOS). The image sensor 21 could further be selected from a ceramic leaded chip carrier (CLCC) package type image sensor, a plastic leaded chip carrier (PLCC) package type image sensor, or a chip scale package (CSP) type image sensor.

The lens module 22 is disposed above the first surface 2311 of the main body 231. The image sensor 21 is received between the lens module 22 and the main body 231 of the circuit board 23. The lens module 22 can be an auto focus lens module with focus adjusting mechanism received therein. The focus adjusting mechanism can be a voice coil motor or a stepping motor.

The lens module 22 has a plurality of electrical connection points 221 on a side surface thereof corresponding to the electrical connection points 2321 on the attachable portion 2323. The electrical connection points 2321 of the attachable portion 2323 can contact with the electrical connection points 221 such that the circuit board 23 can supply power to the lens module 22. In present embodiment, the lens module 22 has two electrical connection points 221 and the attachable portion 2323 has two electrical connection points 2321. It can be understood that lens module 22 can also have three electrical connection points 221 or four electrical connection points 221 and so on. The electrical connection points 221 can be connected with the electrical connection points 2321 by jointing and so on. Preferably, the electrical connection points 221 are actively connected with the electrical connection points 2321. For example, the electrical connection points 221 can be connected with the electrical connection points 2321 by plug contact or magnetic force.

In present embodiment, the camera module 20 also includes a bracket 24 in order that the lens module 22 can be easily secured above the image sensor 21. The bracket 24 has a through hole 241 with a shape similar to the shape of the image sensor 21. The bottom of the bracket 24 is mounted on the first surface 2311 of the main body 231 with the image sensor 21 received in the through hole 241. In present embodiment, the bracket 24 has a plurality of positioning holes 242 and the main body 231 of the circuit board 23 has a plurality of positioning holes 2313 corresponding to the positioning holes 242. The bracket 24 can be secured on the main body 231 by bolts (not shown) extending through the positioning holes 242, 2313.

In present embodiment, the lens module 22 has a metal casing 25 which serves as EMI shielding. The metal casing 25 can be cuboid-shaped without a bottom surface. The bottom surface of the metal casing 25 is secured on the bracket 24. The metal casing 25 has a through hole 2511 on top surface thereof, and light beams can come in the lens module 22 through the through hole 2511. The side surface 252 of the metal casing 25 has a gap 2521 corresponding to the electrical connection points 221, so that the electrical connection points 221 are exposed to outside of the metal casing 25 and can contact with the electrical connection points 2321.

In present embodiment, the circuit board 23 has the bent portion 232 with a plurality of electrical connection points 2321 extending from a side surface of the main body 231. The circuit board 23 can supply power to the lens module 22 by the electrical connection points 2321 electrically connecting with the electrical connection points 221. So that, the second surface 2312 of the main body 231 can keep flat, accordingly, the circuit board 23 can be grounded easily and has enhanced camera module 20 EMI protection.

While certain embodiments have been described and exemplified above, various other embodiments will be apparent to those skilled in the art from the foregoing disclosure. The present invention is not limited to the particular embodiments described and exemplified but is capable of considerable variation and modification without departure from the scope of the appended claims.

What is claimed is:

1. A camera module comprising:
   an image sensor;
   a lens module disposed at an object side of the image sensor and having a plurality of electrical connection points thereon; and
   a circuit board comprising a main body and a bent portion electrically connecting with the main body, the image sensor being mounted on a surface of the main body and received between the lens module and the main body, the bent portion extending from a side surface of the main body non-parallel to said surface of main body and with a plurality of electrical connection points formed thereon corresponding to the electrical connection points of the lens module, the electrical connection points of the bent portion being configured for connecting with the electrical connection points of the lens module to supply power to the lens module wherein the electrical connection points are provided only on one side of the lens module and perpendicular to the main body.

2. The camera module as claimed in claim 1, wherein the bent portion is capable of bending more than 90 degrees relative to the main body.

3. The camera module as claimed in claim 1, wherein the bent portion comprises a flexible portion connecting to the main body and an attachable portion, the electrical connection points on the bent portion are formed on the attachable portion.

4. The camera module as claimed in claim 1, wherein the electrical connection points of the lens module are disposed on a side surface of the lens module non-parallel to the main body of the circuit board.

5. The camera module as claimed in claim 1, wherein the electrical connection points of the bent portion are connected with the electrical connection points of the lens module by jointing.

6. The camera module as claimed in claim 1, wherein the electrical connection points of the bent portion are actively connected with the electrical connection points of the lens module.

7. The camera module as claimed in claim 1, wherein the electrical connection points of the bent portion are connected with the electrical connection points on the lens module by plug contact.

8. The camera module as claimed in claim 1, wherein the electrical connection points on the bent portion are connected with the electrical connection points on the lens module by magnetic force.

9. The camera module as claimed in claim 1, further comprising a bracket for securing the lens module thereon, wherein the bracket is mounted on the surface of the main body and receives the image sensor therein.

10. The camera module as claimed in claim 1, wherein the camera module further comprises a metal casing encasing the lens module for protecting the lens module from electro magnetic interference.

11. A camera module comprising:
   a circuit board comprising a main body with first and second surfaces respectively formed at opposite up and down sides thereof, and a flexible bent portion disposed above the second surface and extending from the main body, a plurality of electrical connection points formed on the bent portion and electrically connected to the main body;
   an image sensor mounted on the first surface of the main body with an object side thereof being away from the first surface; and
   a lens module secured with respect to the circuit board and disposed at the object side of the image sensor, the lens module having a plurality of electrical connection points configured to electrically connect with the electrical connection points of the circuit board to allow the circuit board to supply power to the lens module wherein the electrical connection points are provided only on one side of the lens module and perpendicular to the main body.

12. The camera module as claimed in claim 11, wherein the bent portion comprises a connecting part connected to the main body, and an attachable part extending from the connecting part and capable of being bent relative to the connecting part about a joining line parallel to the first surface of the main body, between the connecting part and the attachable part, the electrical connection points of the bent portion being formed on the attachable part.

13. The camera module as claimed in claim 12, wherein the connecting part of the bent portion extends from a side surface of the main body perpendicular to the first surface.

14. The camera module as claimed in claim 11, further comprising a bracket disposed between the lens module and the main body of the circuit board configured for mounting the lens module to the circuit board.

* * * * *